(12) United States Patent
Tsuchiya et al.

(10) Patent No.: US 8,974,691 B2
(45) Date of Patent: Mar. 10, 2015

(54) COMPOSITION FOR POLISHING AND COMPOSITION FOR RINSING

(75) Inventors: Kohsuke Tsuchiya, Kiyosu (JP); Shuhei Takahashi, Kiyosu (JP)

(73) Assignee: Fujimi Incorporated, Kiyosu-shi (JP)

( * ) Notice: Subject to any disclaimer, the term of this patent is extended or adjusted under 35 U.S.C. 154(b) by 56 days.

(21) Appl. No.: 13/824,149

(22) PCT Filed: Sep. 20, 2011

(86) PCT No.: PCT/JP2011/071364
§ 371 (c)(1),
(2), (4) Date: Mar. 15, 2013

(87) PCT Pub. No.: WO2012/039390
PCT Pub. Date: Mar. 29, 2012

(65) Prior Publication Data
US 2013/0183826 A1 Jul. 18, 2013

(30) Foreign Application Priority Data
Sep. 24, 2010 (JP) .................................. 2010-213382

(51) Int. Cl.
| C09K 13/06 | (2006.01) |
| H01L 21/302 | (2006.01) |
| C09K 13/00 | (2006.01) |
| B24B 37/04 | (2012.01) |
| C09G 1/02 | (2006.01) |
| H01L 21/02 | (2006.01) |
| H01L 21/306 | (2006.01) |
| C09K 3/14 | (2006.01) |

(52) U.S. Cl.
CPC ............... C09K 13/00 (2013.01); B24B 37/044 (2013.01); C09G 1/02 (2013.01); H01L 21/02024 (2013.01); H01L 21/02052 (2013.01); H01L 21/30625 (2013.01); C09K 3/1463 (2013.01)
USPC ......... 252/79.4; 252/79.5; 438/692; 438/693; 438/745; 438/753

(58) Field of Classification Search
CPC .. C09G 1/02; C09K 3/1463; H01L 21/30625; H01L 21/3212; B81C 2201/01014
USPC ......... 438/692, 693, 745, 753; 252/79.4, 79.5
See application file for complete search history.

(56) References Cited

U.S. PATENT DOCUMENTS

| 7,204,865 | B2 | 4/2007 | Yamada | |
| 7,998,229 | B2 | 8/2011 | Yamada | |
| 8,003,128 | B2 | 8/2011 | Kreuter et al. | |
| 2005/0054203 | A1 | 3/2005 | Yamada | |
| 2007/0181851 | A1* | 8/2007 | Yamada | 252/79.1 |
| 2008/0242090 | A1* | 10/2008 | Yamada et al. | 438/692 |
| 2009/0053306 | A1 | 2/2009 | Agarwal et al. | |
| 2009/0263491 | A1 | 10/2009 | Kreuter et al. | |
| 2010/0167972 | A1* | 7/2010 | Kawase et al. | 510/175 |
| 2011/0277524 | A1* | 11/2011 | Ichimoto et al. | 72/42 |
| 2011/0293730 | A1 | 12/2011 | Kreuter et al. | |

FOREIGN PATENT DOCUMENTS

| JP | 04-291722 A | 10/1992 |
| JP | 2005-085858 A | 3/2005 |
| JP | 2007-073548 A | 3/2007 |
| JP | 2007-214205 A | 8/2007 |
| JP | 2008-182221 A | 8/2008 |
| JP | 2009-510115 A | 3/2009 |
| JP | 2009-105299 A | 5/2009 |
| JP | 2009-530325 A | 8/2009 |
| JP | 2010-129941 A | 6/2010 |

* cited by examiner

Primary Examiner — Binh X Tran
(74) Attorney, Agent, or Firm — Foley & Lardner LLP

(57) ABSTRACT

A polishing composition for a silicon wafer and a rinsing composition for a silicon wafer according to the present invention contain a nonionic surfactant of a polyoxyethylene adduct. The HLB value of the polyoxyethylene adduct is 8 to 15. The weight-average molecular weight of the polyoxyethylene adduct is 1400 or less. The average number of moles of oxyethylene added in the polyoxyethylene adduct is 13 or less. The content of the polyoxyethylene adduct in each of the polishing composition and the rinsing composition is 0.00001 to 0.1% by mass.

7 Claims, No Drawings

COMPOSITION FOR POLISHING AND COMPOSITION FOR RINSING

TECHNICAL FIELD

The present invention relates to a polishing composition used for polishing a silicon wafer and a rinsing composition used for rinsing a silicon wafer. Moreover, the present invention relates to a method of polishing a silicon wafer by using the polishing composition and a method of rinsing a silicon wafer by using the rinsing composition.

BACKGROUND ART

In order to achieve high integration and high speed of integrated circuits, such as ULSIs, used for computers, miniaturization of design rule of semiconductor devices has been progressed year by year. Because of this, the instances that tinier surface defects adversely affect performance of the semiconductor devices have been increased, and the importance of managing nano-scale defects which have not been acknowledged as a problem is increasing.

Surface defect inspection equipment is used for managing surface defects of a silicon wafer. The defects detected by the surface defect inspection equipment include foreign materials and residues, which could not be removed from a silicon wafer surface in a polishing process, a rinsing process, and a washing process. General surface defect inspection equipment is adapted to detect the presence or absence and the size of defects by irradiating a silicon wafer surface with light, such as laser light, and receiving and analyzing the reflected light as a signal.

When irradiating a mirror-finished silicon wafer surface after polishing or polishing and rinsing with intense light, in some cases, tarnish is observed by diffused reflection due to very fine roughness on the silicon wafer surface. The tarnish is called haze, and the haze can be used as a measure of roughness of a silicon wafer surface. When there is haze on a silicon wafer surface, diffused reflection light generated by the haze becomes noise and defect detection by surface defect inspection equipment may be prevented. Therefore, as the size of defects to be detected, that is, the size of defects to be managed becomes smaller, the necessity of improving a haze level is increasing.

Patent Document 1 discloses a polishing composition containing a nonionic surfactant of a copolymer of polyoxyethylene and polyoxypropylene for the main purpose of reducing haze on a silicon wafer surface after polishing. Patent Document 2 discloses a polishing composition containing polyoxyethylene sorbitan mono-fatty acid ester for the main purpose of reducing haze on a silicon wafer surface after final polishing. However, the haze reduction effect by the polishing compositions of Patent Documents 1 and 2 is not enough to manage nano-scale defects.

PRIOR ART DOCUMENTS

Patent Document 1: Japanese Laid-Open Patent Publication No. 2005-85858
Patent Document 2: Japanese Laid-Open Patent Publication No. 2007-214205

SUMMARY OF THE INVENTION

Problems that the Invention is to Solve

Accordingly, it is an objective of the present invention to provide a polishing composition and a rinsing composition that can further reduce haze on a silicon wafer surface.

Means for Solving the Problems

To achieve the foregoing objective and in accordance with a first aspect of the present invention, a polishing composition for a silicon wafer is provided containing water, a basic compound, and a nonionic surfactant of a polyoxyethylene adduct, the HLB value of the polyoxyethylene adduct being 8 to 15, the weight-average molecular weight of the polyoxyethylene adduct being 1400 or less, the average number of moles of oxyethylene added in the polyoxyethylene adduct being 13 or less, and the content of the polyoxyethylene adduct in the polishing composition being 0.00001 to 0.1% by mass.

In accordance with a second aspect of the present invention, a rinsing composition for a silicon wafer is provided containing water and a nonionic surfactant of a polyoxyethylene adduct, the HLB value of the polyoxyethylene adduct being 8 to 15, the weight-average molecular weight of the polyoxyethylene adduct being 1400 or less, the average number of moles of oxyethylene added in the polyoxyethylene adduct being 13 or less, and the content of the polyoxyethylene adduct in the polishing composition being 0.00001 to 0.1% by mass.

In accordance with a third aspect of the present invention, a method of polishing a silicon wafer is provided including polishing a silicon wafer by using the polishing composition of the first aspect.

In accordance with a fourth aspect of the present invention, a method of rinsing a silicon wafer is provided including rinsing a silicon wafer after polishing, by using the rinsing composition of the second aspect.

Effects of the Invention

According to the present invention, haze can be reduced by suppressing a silicon wafer surface roughness, which is caused by polishing or rinsing of the silicon wafer. As a result, assessment of fine defects and product management based thereon can be easily carried out.

MODES FOR CARRYING OUT THE INVENTION

Hereinafter, embodiments according to the present invention will be described.
Polishing Composition and Rinsing Composition
<Nonionic Surfactant of Polyoxyethylene Adduct>
One of the features of a polishing composition and a rinsing composition of the present invention is that they contain a nonionic surfactant of a polyoxyethylene adduct, that is, a polyoxyethylene addition nonionic surfactant. The HLB value of the polyoxyethylene addition nonionic surfactant is 8 to 15. The weight-average molecular weight of the polyoxyethylene addition nonionic surfactant is 1400 or less. The average number of moles of oxyethylene added in the polyoxyethylene addition nonionic surfactant is 13 or less. The content of the polyoxyethylene addition nonionic surfactant in each of the polishing composition and the rinsing composition is 0.00001 to 0.1% by mass.

In the present description, the HLB (Hydrophile-Lipophile Balance) value is defined by the Griffin method. According to the Griffin method, the HLB value is calculated from 20×(the sum of the molecular weights of hydrophilic moieties)/(the sum of the molecular weights of hydrophilic moieties and the molecular weights of hydrophobic moieties). Examples of the hydrophilic moieties include an oxyethylene group, a hydroxyl group, a carboxyl group, and esters. Examples of the hydrophobic moieties include an oxypropylene group, an oxybutylene group, and an alkyl group.

According to studies by the present inventors, it was found that in the case where a silicon wafer surface is polished by using a polishing composition containing a polyoxyethylene addition nonionic surfactant, a haze level of the silicon wafer surface after polishing depends on the HLB value of the surfactant. In addition, it was found that in the case where a silicon wafer surface is rinsed by using a rinsing composition containing a polyoxyethylene addition nonionic surfactant, a haze level of the silicon wafer surface after rinsing depends on the HLB value of the surfactant. In terms of reducing haze on a silicon wafer surface, the HLB value of the polyoxyethylene addition nonionic surfactant to be used needs to be 15 or less, and preferably 13 or less. When the HLB value is 15 or less, the surfactant is effective in suppressing roughness on a silicon wafer surface, and haze on the silicon wafer surface is reduced.

Moreover, the HLB value of the polyoxyethylene addition nonionic surfactant needs to be 8 or more, preferably 10 or more, and further preferably 12 or more. A polyoxyethylene addition nonionic surfactant having an HLB value of 8 or more is easily dissolved or dispersed in the polishing composition and the rinsing composition.

According to studies by the present inventors, it was found that in the case where a silicon wafer surface is polished by using a polishing composition containing a polyoxyethylene addition nonionic surfactant, a haze level of the silicon wafer surface after polishing depends on the molecular weight of the surfactant as well. In addition, it was found that in the case where a silicon wafer surface is rinsed by using a rinsing composition containing a polyoxyethylene addition nonionic surfactant, a haze level of the silicon wafer surface after rinsing depends on the molecular weight of the surfactant as well. In terms of reducing haze on a silicon wafer surface, the weight-average molecular weight of the polyoxyethylene addition nonionic surfactant to be used needs to be 1400 or less, preferably 1000 or less, more preferably 700 or less, and further preferably 400 or less. When the weight-average molecular weight is 1400 or less, a sufficient effect of suppressing roughness on a silicon wafer surface can be obtained, and haze on the silicon wafer surface is sufficiently reduced.

In order to obtain better effect of suppressing roughness on a silicon wafer surface, the weight-average molecular weight of the polyoxyethylene addition nonionic surfactant is preferably more than 200, and more preferably 300 or more. When the weight-average molecular weight is more than 200, furthermore 300 or more, a sufficient effect of suppressing roughness on a silicon wafer surface can be obtained.

In principle, the average number of moles of oxyethylene added in the polyoxyethylene addition nonionic surfactant refers to an average value of the number of moles of an oxyethylene unit in 1 mole of the polyoxyethylene adduct. However, in the case of a polyoxyethylene adduct having polyoxyethylene chains in one molecule, such as polyoxyethylene sorbitan monooleate, an average value obtained by dividing the total number of moles of an oxyethylene unit contained in one molecule of the polyoxyethylene adduct by the number of the polyoxyethylene chains contained in the same molecule is regarded as the average number of moles of oxyethylene added. That is, the average number of moles of oxyethylene added in the polyoxyethylene addition nonionic surfactant indicates the length of the polyoxyethylene chain(s) contained in the surfactant.

According to studies by the present inventors, it was found that in the case where a silicon wafer surface is polished by using a polishing composition containing a polyoxyethylene addition nonionic surfactant, a haze level of the silicon wafer surface after polishing depends on the average number of moles of oxyethylene added in the surfactant as well. In addition, it was found that in the case where a silicon wafer surface is rinsed by using a rinsing composition containing a polyoxyethylene addition nonionic surfactant, a haze level of the silicon wafer surface after rinsing depends on the average number of moles of oxyethylene added in the surfactant as well. In terms of reducing haze on a silicon wafer surface, the average number of moles of oxyethylene added in the polyoxyethylene addition nonionic surfactant to be used needs to be 13 or less, preferably 10 or less, and more preferably 6 or less. When the average number of moles of oxyethylene added is 13 or less, the polyoxyethylene addition nonionic surfactant is sufficiently effective in suppressing roughness on a silicon wafer surface, and haze on the silicon wafer surface is reduced.

In order to further reduce haze on a silicon wafer surface, the average number of moles of oxyethylene added in the polyoxyethylene addition nonionic surfactant is preferably 2 or more, and more preferably 4 or more. When the average number of moles of oxyethylene added in the polyoxyethylene addition nonionic surfactant is 2 or more, furthermore 4 or more, haze on a silicon wafer surface is sufficiently reduced.

The polyoxyethylene addition nonionic surfactant used in the polishing composition and the rinsing composition of the present invention is not particularly limited as long as it has an HLB value of 8 to 15, a weight-average molecular weight of 1400 or less, and an average number of moles of oxyethylene added of 13 or less. Specific examples of such a polyoxyethylene addition nonionic surfactant include polyoxyethylene alkyl ether, polyoxyethylene phenyl ether, polyoxyethylene alkyl phenyl ether, polyoxyethylene alkylamine, polyoxyethylene alkylamide, polyoxyethylene fatty acid ester, polyoxyethylene sorbitan fatty acid ester, polyoxyethylene sorbitol fatty acid ester, polyoxyethylene castor oil, and polyoxyethylene rosin ester. More specifically, polyoxyethylene propyl ether, polyoxyethylene butyl ether, polyoxyethylene pentyl ether, polyoxyethylene hexyl ether, polyoxyethylene octyl ether, polyoxyethylene-2-ethylhexyl ether, polyoxyethylene nonyl ether, polyoxyethylene decyl ether, polyoxyethylene isodecyl ether, polyoxyethylene tridecyl ether, polyoxyethylene lauryl ether, polyoxyethylene cetyl ether, polyoxyethylene stearyl ether, polyoxyethylene isostearyl ether, polyoxyethylene oleyl ether, polyoxyethylene phenyl ether, polyoxyethylene octylphenyl ether, polyoxyethylene nonylphenyl ether, polyoxyethylene dodecylphenyl ether, polyoxyethylene styrenated phenyl ether, polyoxyethylene laurylamine, polyoxyethylene stearylamine, polyoxyethylene oleylamine, polyoxyethylene stearylamide, polyoxyethylene oleylamide, polyoxyethylene monolaurate ester, polyoxyethylene monostearate ester, polyoxyethylene distearate ester, polyoxyethylene monooleate ester, polyoxyethylene dioleate ester, polyoxyethylene sorbitan monolaurate, polyoxyethylene sorbitan monopalmitate, polyoxyethylene sorbitan monostearate, polyoxyethylene sorbitan monooleate, polyoxyethylene sorbitan trioleate, polyoxyethylene sorbitol tetraoleate, polyoxyethylene castor oil, polyoxyethylene hydrogenated castor oil, or polyoxyethylene polyoxypropylene glycol can be used. These surfactants may be used singly or in combinations of two or more types.

The content of the polyoxyethylene addition nonionic surfactant in each of the polishing composition and the rinsing composition needs to be 0.00001% by mass or more, and preferably 0.00005% by mass or more. When the content of the polyoxyethylene addition nonionic surfactant is 0.00001% by mass or more, a sufficient effect of suppressing roughness on a silicon wafer surface can be obtained, and haze on the silicon wafer surface is sufficiently reduced.

Moreover, the content of the polyoxyethylene addition nonionic surfactant in each of the polishing composition and the rinsing composition needs to be 0.1% by mass or less, and preferably 0.05% by mass or less. When the content of the polyoxyethylene addition nonionic surfactant is 0.1% by mass or less, an advantage is that it becomes difficult for the polishing composition and the rinsing composition to bubble up.

<Basic Compound>

The polishing composition of the present invention contains a basic compound. The basic compound in the polishing composition functions to etch a silicon wafer surface to chemically polish it.

The usable basic compound is not particularly limited as long as it has a function for etching a silicon wafer, and specific examples thereof include ammonia, potassium hydroxide, sodium hydroxide, tetramethylammonium hydroxide, tetraethylammonium hydroxide, ammonium hydrogen carbonate, ammonium carbonate, potassium hydrogen carbonate, potassium carbonate, sodium hydrogen carbonate, sodium carbonate, methylamine, dimethylamine, trimethylamine, ethylamine, diethylamine, triethylamine, ethylenediamine, monoethanolamine, N-(β-aminoethyl) ethanolamine, hexamethylenediamine, diethylenetriamine, triethylenetetramine, tetraethylenepentamine, anhydrous piperazine, piperazine hexahydrate, 1-(2-aminoethyl)piperazine, and N-methylpiperazine. These basic compounds may be used singly or in combinations of two or more types.

In order to suppress metal contamination of a silicon wafer after polishing, the basic compound is preferably ammonia, an ammonium salt, an alkali metal hydroxide, an alkali metal salt, or quaternary ammonium hydroxide. More specifically, the basic compound is preferably selected from the group consisting of ammonia, potassium hydroxide, sodium hydroxide, tetramethylammonium hydroxide, tetraethylammonium hydroxide, ammonium hydrogen carbonate, ammonium carbonate, potassium hydrogen carbonate, potassium carbonate, sodium hydrogen carbonate, and sodium carbonate, more preferably, ammonia, potassium hydroxide, sodium hydroxide, tetramethylammonium hydroxide, or tetraethylammonium hydroxide, and most preferably, ammonia.

The content of the basic compound in the polishing composition is preferably 0.0001% by mass or more, and more preferably 0.001% by mass or more. When the content of the basic compound is 0.0001% by mass or more, and more specifically 0.001% by mass or more, the polishing rate of a silicon wafer is improved.

Moreover, the content of the basic compound in the polishing composition is preferably 0.5% by mass or less, and more preferably 0.25% by mass or less. When the content of the basic compound is 0.5% by mass or less, and more specifically 0.25% by mass or less, a silicon wafer having small surface roughness is easily obtained.

The rinsing composition of the present invention may contain a basic compound. Specific examples of the basic compound contained in the rinsing composition are the same with the above-described compounds as the specific examples of the basic compound contained in the polishing composition. The basic compound in the rinsing composition is effective in removing residues remaining on a silicon wafer surface after polishing. However, in order to suppress roughness on a silicon wafer surface after rinsing, the content of the basic compound in the rinsing composition is preferably 0.00001% by mass to 0.5% by mass, and more preferably 0.0001% by mass to 0.1% by mass.

<Water>

The polishing composition and the rinsing composition of the present invention contain water. The water functions to dissolve or disperse other components in the polishing composition or the rinsing composition. Preferably, the water does not contain, as much as possible, impurities that inhibit the actions of other components. More specifically, ion-exchange water, from which foreign materials are removed by being passed through a filter after removing impurity ions with an ion-exchange resin, pure water, ultrapure water, or distilled water is preferable.

<Abrasive Grains>

The polishing composition of the present invention may contain abrasive grains. The abrasive grains function to physically polish a silicon wafer surface.

Specific examples of the usable abrasive grains include silicon carbide, silicon dioxide, alumina, ceria, zirconia, and diamond, but are not limited thereto. Among them, the case where silicon dioxide, such as colloidal silica, fumed silica, and sol-gel-derived silica, is used is preferable because surface roughness of a silicon wafer tends to be further reduced compared to the case where another type of abrasive grains are used. Moreover, colloidal silica or fumed silica, especially colloidal silica, is preferable because the number of scratches to be generated on a silicon wafer surface by polishing is reduced. These abrasive grains may be used singly or in combinations of two or more types.

The average primary particle diameter of the abrasive grains to be used, which is obtained from a specific surface area determined by a specific surface area determination method (BET method) of powder by using gas adsorption, is preferably 5 to 100 nm, and more preferably 10 to 40 nm.

The content of the abrasive grains in the polishing composition is preferably 0.001% by mass or more, and more preferably 0.005% by mass or more. When the content of the abrasive grains is 0.001% by mass or more, and more specifically 0.005% by mass or more, the polishing rate of a silicon wafer is improved.

Moreover, the content of the abrasive grains in the polishing composition is preferably 5% by mass or less, and more preferably 1% by mass or less. When the content of the abrasive grains is 5% by mass or less, and more specifically 1% by mass or less, the dispersion stability of the polishing composition is improved.

<Wetting Agent>

The polishing composition and the rinsing composition of the present invention may further contain a wetting agent. The wetting agent is effective in keeping a silicon wafer surface hydrophilic. When the hydrophilic properties of a silicon wafer surface decrease, foreign materials attached to the silicon wafer tend to remain without being removed by washing. When the foreign materials remain on a silicon wafer, surface accuracy of the silicon wafer may decrease.

Examples of the usable wetting agent include a cellulose derivative, such as hydroxyethyl cellulose, hydroxypropyl cellulose, and carboxymethyl cellulose, a vinyl polymer, such as polyvinyl alcohol, polyvinyl pyrrolidone, and poly-N-vinylformamide, a polysaccharide, such as starch, cyclodextrin, trehalose, and pullulan, and other water-soluble polymers, such as polyacrylamide and polymethylmethacrylate. The cellulose derivative is preferable because it has high ability to impart wettability to a silicon wafer surface and can be easily washed away from the silicon wafer without remaining thereon, and in particular, hydroxyethyl cellulose is more preferable.

The weight-average molecular weight of the wetting agent to be used is preferably 30,000 or more, and more preferably 50,000 or more. When the weight-average molecular weight of the wetting agent is 30,000 or more, and more specifically 50,000 or more, the effect of imparting hydrophilic properties to a silicon wafer surface is sufficiently produced.

Moreover, the weight-average molecular weight of the wetting agent is preferably 2,000,000 or less, more preferably 1,000,000 or less, and most preferably 600,000 or less. When the weight-average molecular weight of the wetting agent is 2,000,000 or less, and more specifically 1,000,000 or less or 600,000 or less, the dispersion stability of the polishing composition and the rinsing composition is improved.

The content of the wetting agent in the polishing composition is preferably 0.001% by mass or more. When the content of the wetting agent is 0.001% by mass or more, the effect of imparting hydrophilic properties to a silicon wafer surface is sufficiently produced.

Moreover, the content of the wetting agent in the polishing composition is preferably 1% by mass or less, and more preferably 0.5% by mass or less. When the content of the wetting agent is 1% by mass or less, and more specifically 0.5% by mass or less, the dispersion stability of the polishing composition is improved.

The content of the wetting agent in the rinsing composition is preferably 0.001% by mass or more. When the content of the wetting agent is 0.001% by mass or more, the effect of imparting hydrophilic properties to a silicon wafer surface is sufficiently produced.

Moreover, the content of the wetting agent in the rinsing composition is preferably 1% by mass or less, and more preferably 0.5% by mass or less. When the content of the wetting agent is 1% by mass or less, and more specifically 0.5% by mass or less, the cleanliness of a silicon wafer surface is improved.

The polishing composition and the rinsing composition of the present invention may further contain other components. For example, the polishing composition and the rinsing composition may further contain a chelating agent. When the chelating agent is contained, metal contamination of a silicon wafer due to the polishing composition or the rinsing composition can be suppressed. Examples of the usable chelating agents include aminocarboxylic acid chelating agents and organic phosphonic acid chelating agents. The aminocarboxylic acid chelating agents include ethylenediaminetetraacetic acid, sodium ethylenediaminetetraacetate, nitrilotriacetic acid, sodium nitrilotriacetate, ammonium nitrilotriacetate, hydroxyethyl ethylenediaminetriacetic acid, sodium hydroxyethyl ethylenediaminetriacetate, diethylenetriaminepentaacetic acid, sodium diethylenetriaminepentaacetate, triethylenetetraaminehexaacetic acid, and sodium triethylenetetraaminehexaacetate. The organic phosphonic acid chelating agents include 2-aminoethylphosphonic acid, 1-hydroxyethylidene-1,1-diphosphonic acid, aminotri(methylenephosphonic acid), ethylenediaminetetrakis(methylenephosphonic acid), nitrilotris(methylenephosphonic acid), diethylenetriaminepenta(methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxy phosphonic acid, 2-phosphonobutane-1,2-dicarboxylic acid, 1-phosphonobutane-2,3,4-tricarboxylic acid, 2-phosphonobutane-2,3,4-tricarboxylic acid, and α-methyl phosphonosuccinic acid.

The polishing composition and the rinsing composition of the present invention may further contain a known additive, such as an antiseptic and a surfactant, as needed.

By polishing or rinsing a silicon wafer surface by using the polishing composition or the rinsing composition of the present invention, high-accuracy surface in which nano-scale defects are suppressed can be obtained. Therefore, the polishing composition is suitably used for final polishing of a silicon wafer, in which particularly-high surface accuracy is required, and the rinsing composition is suitably used for rinsing a silicon wafer after final polishing.

Although the reason why the high-accuracy silicon wafer surface can be obtained by using the polishing composition or the rinsing composition of the present invention has not been clearly understood, it is attributed to an appropriate balance between an event in which a silicon wafer surface is efficiently coated and protected by the specific surfactant in the polishing composition or the rinsing composition and an event in which surface defects of a silicon wafer including foreign materials attached to the silicon wafer surface are etched by the basic compound in the polishing composition or the rinsing composition.

Manufacturing Method of Polishing Composition and Rinsing Composition

The polishing composition and the rinsing composition of the present invention can be manufactured by dissolving or dispersing in water the above-described respective components other than water by a usual method. The order of adding the respective components to the water is not particularly limited. Dissolving or dispersing method is not particularly limited, and can be performed by a general method, for example, stirring with a wing-type stirrer or dispersing with a homogenizer.

Concentrated Liquid for Preparing Polishing Composition and Rinsing Composition

The polishing composition and the rinsing composition of the present invention can be manufactured as described above. However, it is bothersome to arrange necessary components respectively and prepare these compositions immediately before performing polishing or rinsing. In contrast, it is a disadvantage to manufacture or purchase the polishing composition and the rinsing composition in large amounts and store them before use because storage cost is expensive and it is difficult to maintain certain quality of these compositions for long periods of time. Therefore, the polishing composition or the rinsing composition may be stored in the form of concentrated liquid, which is obtained by removing a part of water from a constituent thereof, and be prepared by diluting the concentrated liquid with water when needed. The concentrated liquid of each of the polishing composition and the rinsing composition may be in the form of a kit composed of two or more packages having different constituents. By mixing the two or more packages when needed and diluting the mixture with water, the polishing composition or the rinsing composition can be prepared. Generally, water used for dilution is available everywhere. Therefore, by performing conveyance and storage in the form of the concentrated liquid or the kit, which has small volume, conveyance cost and storage cost can be reduced. Another advantage is that preservation stability is improved in the form of the concentrated liquid or the kit.

In order to reduce the volume of the concentrated liquid or the kit, it is preferable that the amount of water contained in the concentrated liquid or the kit be as little as possible. However, since a dilution procedure becomes bothersome if the basic compound or the polyoxyethylene addition nonionic surfactant is precipitated in the concentrated liquid or the kit, it is preferable that the concentrated liquid or the kit contain at least enough water to uniformly dissolve the basic compound and the polyoxyethylene addition nonionic surfactant in the concentrated liquid or the kit.

In the case where the polishing composition of the present invention contains abrasive grains, the abrasive grains may be preserved before use in a package different from a package containing the basic compound and the polyoxyethylene addition nonionic surfactant. In this case, the package containing the basic compound and the polyoxyethylene addition nonionic surfactant can be used for preparing the polishing composition with being mixed with the abrasive grains or can be used for preparing the rinsing composition without being mixed with the abrasive grains.

Although not particularly limited, a concentration rate of the concentrated liquid is preferably two times or more, more preferably five times or more, and further preferably twenty times or more. The term "concentration rate" of the concentrated liquid means a ratio of the total volume of the polishing composition or the rinsing composition prepared from the concentrated liquid or the kit with respect to the total volume of the concentrated liquid or the total volume of the kit.

The concentration of the polyoxyethylene addition nonionic surfactant in the concentrated liquid is preferably 0.00002 to 10% by mass, more preferably 0.00005 to 1% by mass, and further preferably 0.0001 to 0.2% by mass. In this case, by diluting the concentrated liquid with water at a predetermined dilution ratio, the polishing composition or the rinsing composition containing the polyoxyethylene addition nonionic surfactant at an appropriate concentration can be obtained.

Polishing Method and Rinsing Method

The polishing composition of the present invention can be used in the same device and under the same condition with those used for usual polishing of a silicon wafer.

When a silicon wafer is polished by using the polishing composition of the present invention, any kind of polishing pads, such as a non-woven type and a suede type, may be used. The polishing pad to be used may contain abrasive grains or may not contain abrasive grains.

Although not particularly limited, a use temperature of the polishing composition of the present invention is preferably 5 to 60° C.

The polishing composition of the present invention may be used at any step of so-called multistep polishing. That is, the polishing composition may be used in polishing to improve a damaged layer of a silicon wafer or may be used in final polishing to finish a surface layer of a silicon wafer. Polishing time of the polishing to improve a damaged layer of a silicon wafer is generally 0.1 to 10 hours although it depends on the depth of the damaged layer. Polishing time of the final polishing to finish a surface layer of a silicon wafer is usually 30 minutes or less.

The rinsing composition of the present invention is used for removing residues remaining on a smooth silicon wafer surface after being polished with the polishing composition containing abrasive grains. The rinsing composition of the present invention can be used in the same device and under the same condition with those used for usual rinsing of a silicon wafer. For example, rinsing of a silicon wafer can be performed, with a pad in contact with the silicon wafer surface, by rotating the pad and/or the silicon wafer while feeding the rinsing composition to the contact surface.

Any kind of pads, such as a non-woven type and a suede type, may be used as a pad used when a silicon wafer is rinsed with the rinsing composition of the present invention, and the pad may contain abrasive grains or may not contain abrasive grains.

Although not particularly limited, a use temperature of the rinsing composition of the present invention is preferably 5 to 60° C.

The rinsing composition of the present invention is used when rinsing a silicon wafer after polishing to improve a damaged layer of the silicon wafer and/or final polishing with the polishing composition of the present invention or another polishing composition. In the case where the rinsing composition of the present invention is used for rinsing a silicon wafer after being polished with the polishing composition of the present invention, haze of the silicon wafer after rinsing is drastically reduced.

Rinsing of a silicon wafer with the rinsing composition of the present invention can be performed for the silicon wafer attached to a device used for polishing, immediately after polishing of the silicon wafer. In this case, even if the basic compound is contained in the polishing composition remaining on the pad, roughness generation on the silicon wafer surface due to the basic compound can be suppressed.

Next, Examples and Comparative Examples of the present invention will be described.

Examples 1 to 10 and Comparative Examples 1 to 16

A polishing composition of Comparative Example 1 was prepared by mixing abrasive grains, a basic compound, and a wetting agent into ion-exchange water. Each of polishing compositions of Examples 1 to 10 and Comparative Examples 2 to 16 was prepared by mixing a polyoxyethylene addition nonionic surfactant or an alternative compound thereof together with abrasive grains, a basic compound, and a wetting agent into ion-exchange water. The details of the polyoxyethylene addition nonionic surfactant or the alternative compound thereof in the respective polishing compositions of Examples 1 to 10 and Comparative Examples 2 to 16 are shown in Table 1. Polyethylene glycol used in Comparative Examples 2 and 3 does not correspond to a polyoxyethylene addition nonionic surfactant. Although not shown in Table 1, each of the polishing compositions of Examples 1 to 7 and Comparative Examples 1 to 16 contained 0.18% by mass of colloidal silica having a particle diameter of 25 nm as abrasive grains, 0.005% by mass of ammonia as a basic compound, and 0.01% by mass of hydroxyethyl cellulose having a weight-average molecular weight of 250,000 as a wetting agent, and each of the polishing compositions of Examples 8 to 10 contained 0.46% by mass of colloidal silica having a particle diameter of 35 nm as abrasive grains, 0.01% by mass of ammonia as a basic compound, and 0.018% by mass of hydroxyethyl cellulose having a weight-average molecular weight of 250,000 as a wetting agent. Values of average primary particle diameters of colloidal silica were measured with a surface area measuring instrument FlowSorb II 2300 (trade name, made by Micromeritics Instrument Corporation).

The silicon wafer surfaces were respectively polished under conditions described in the following "Polishing Conditions 1" by using the polishing compositions of Examples 1 to 10 and Comparative Examples 1 to 16. The used silicon wafers had a disk shape having a diameter of 200 mm, p-type conduction, a crystal orientation of <100>, and a resistivity of 0.1 Ω·cm or more and less than 100 Ω·cm. The silicon wafers were used after preliminary polishing with a polishing slurry (trade name of GLANZOX 1104) made by Fujimi Incorporated.

<Polishing Conditions 1>
Polishing machine: Single wafer polishing machine PNX-322 (made by Okamoto Machine Tool Works, Ltd.)
Polishing load: 15 kPa
Rotation speed of surface plate: 30 rpm
Rotation speed of head: 30 rpm
Polishing time: 4 min.
Temperature of polishing composition: 20° C.
Feed rate of polishing composition: 0.5 L/min. (continuously fed without being circulated)

The silicon wafer surfaces after polishing by using the respective polishing compositions of Examples 1 to 10 and Comparative Examples 1 to 16 were measured by wafer inspection equipment "Surfscan SP2" made by KLA-Tencor Corporation in DWO mode, and the results of assessment of haze levels of the silicon wafer surfaces after polishing based on the measurement are shown in the column "haze" in Table 1. In the column, "A" means that the haze level was reduced by 10% or more compared to Comparative Example 1 not containing a polyoxyethylene addition nonionic surfactant, "B" means that the reduction of the haze level was less than 10%, and "C" means that the reduction of the haze level was not observed compared to Comparative Example 1. With respect to Comparative Example 16, assessment of the haze level could not be performed because polyoxyethylene dioleate ester was poorly dissolved.

The silicon wafer surfaces having p-type conduction, a crystal orientation of <100>, a resistivity of 0.1 Ω·cm or more and less than 100 Ω·cm, and a size of 60 mm square were respectively preliminarily polished with a polishing slurry (trade name of GLANZOX 1104) made by Fujimi Incorporated, and then, were polished under conditions described in the following "Polishing Conditions 2" by using the respective polishing compositions of Examples 1 to 10 and Comparative Examples 1 to 16. Each of the silicon wafer surfaces after polishing was rinsed with running water for 10 seconds at a flow rate of 7 L/min., and then, the silicon wafer was vertically stood and left at rest. After a lapse of 30 seconds, a maximum distance between the outer edge of the silicon wafer and a wet region on the silicon wafer surface was measured, and the results of assessment of wettability on the silicon wafer surfaces after polishing based on the measurement are shown in the column "wettability" in Table 1. In the column, "A" means that the maximum distance between the outer edge of the silicon wafer and the wet region was 5 mm or less, "B" means that the maximum distance was more than 5 mm and 40 mm or less, and "C" means that the maximum distance was more than 40 mm. With respect to Comparative Example 16, assessment of the wettability could not be performed because polyoxyethylene dioleate ester was poorly dissolved.

<Polishing Conditions 2>
Polishing machine: Bench-type polishing machine EJ-3801N (made by Engis Japan Corporation)
Polishing load: 15 kPa
Rotation speed of surface plate: 30 rpm
Rotation speed of head: 30 rpm
Polishing time: 1 min.
Temperature of polishing composition: 20° C.
Feed rate of polishing composition: 0.25 L/min. (continuously fed without being circulated)

TABLE 1

| | polyoxyethylene addition nonionic surfactant or alternative compound thereof | | | | | assessment | |
|---|---|---|---|---|---|---|---|
| | kind | content (% by mass) | HLB value | weight-average molecular weight | average number of moles of oxyethylene added | haze | wettability |
| Example 1 | polyoxyethylene 2-ethylhexyl ether | 0.00013 | 11.5 | 310 | 4 | A | A |
| Example 2 | polyoxyethylene decyl ether | 0.00013 | 12.1 | 380 | 5 | A | A |
| Example 3 | polyoxyethylene decyl ether | 0.00013 | 14.7 | 600 | 10 | A | B |
| Example 4 | polyoxyethylene isodecyl ether | 0.00013 | 12.3 | 380 | 5 | A | A |
| Example 5 | polyoxyethylene lauryl ether | 0.00013 | 10.5 | 410 | 5 | A | B |
| Example 6 | polyoxyethylene styrenated phenyl ether | 0.00013 | 13.0 | 780 | 13 | A | B |
| Example 7 | polyoxyethylene sorbitan monooleate | 0.00013 | 15.0 | 1310 | 7 | A | A |
| Example 8 | polyoxyethylene decyl ether | 0.00025 | 12.1 | 380 | 5 | A | A |
| Example 9 | polyoxyethylene decyl ether | 0.0013 | 12.1 | 380 | 5 | A | A |
| Example 10 | polyoxyethylene decyl ether | 0.0025 | 12.1 | 380 | 5 | A | A |
| Comparative Example 1 | — | — | — | — | — | C | A |
| Comparative Example 2 | polyethylene glycol | 0.00013 | 20.0 | 200 | 4 | B | A |
| Comparative Example 3 | polyethylene glycol | 0.00013 | 20.0 | 400 | 9 | B | A |
| Comparative Example 4 | polyoxyethylene lauryl ether | 0.00013 | 14.9 | 850 | 15 | B | C |
| Comparative Example 5 | polyoxyethylene lauryl ether | 0.00013 | 17.4 | 1510 | 30 | C | C |
| Comparative Example 6 | polyoxyethylene lauryl ether | 0.00013 | 17.7 | 1960 | 40 | C | C |
| Comparative Example 7 | polyoxyethylene cetyl ether | 0.00013 | 15.5 | 1120 | 20 | C | C |
| Comparative Example 8 | polyoxyethylene cetyl ether | 0.00013 | 16.3 | 1340 | 25 | C | C |
| Comparative Example 9 | polyoxyethylene hydrogenated castor oil | 0.00013 | 9.7 | 1190 | 20 | B | B |

TABLE 1-continued polyoxyethylene addition nonionic surfactant or alternative compound thereof

| | kind | content (% by mass) | HLB value | weight-average molecular weight | average number of moles of oxyethylene added | assessment haze | wettability |
|---|---|---|---|---|---|---|---|
| Comparative Example 10 | polyoxyethylene hydrogenated castor oil | 0.00013 | 14.8 | 2950 | 60 | B | B |
| Comparative Example 11 | polyoxyethylene sorbitan monooleate | 0.000005 | 15.0 | 1310 | 7 | B | A |
| Comparative Example 12 | polyoxyethylene sorbitan monooleate | 0.3 | 15.0 | 1310 | 7 | C | C |
| Comparative Example 13 | polyoxyethylene sorbitan trioleate | 0.00013 | 11.0 | 1800 | 7 | C | B |
| Comparative Example 14 | polyoxyethylene sorbitol tetraoleate | 0.00013 | 11.5 | 4500 | 5 | C | B |
| Comparative Example 15 | polyoxyethylene polyoxypropylene glycol | 0.0013 | 16.0 | 9000 | 80 | B | A |
| Comparative Example 16 | polyoxyethylene dioleate ester | 0.00013 | 7.9 | 950 | 8 | — | — |

As shown in Table 1, the haze levels of the silicon wafer surfaces after polishing in Examples 1 to 10 are lower compared to Comparative Examples 1 to 16.

Example 11 and Comparative Examples 17 and 18

A rinsing composition of Comparative Example 17 was prepared by mixing a basic compound and a wetting agent into ion-exchange water. Each of rinsing compositions of Example 11 and Comparative Example 18 was prepared by mixing a polyoxyethylene addition nonionic surfactant together with a basic compound and a wetting agent into ion-exchange water. The details of the polyoxyethylene addition nonionic surfactant in the respective rinsing compositions of Example 11 and Comparative Examples 17 and 18 are shown in Table 2. Although not shown in Table 2, each of the rinsing compositions of Example 11 and Comparative Examples 17 and 18 contained 0.0005% by mass of ammonia as a basic compound and 0.01% by mass of hydroxyethyl cellulose having a weight-average molecular weight of 250,000 as a wetting agent.

The silicon wafer surfaces were respectively rinsed under conditions described in the following "Rinsing Conditions" by using the rinsing compositions of Example 11 and Comparative Examples 17 and 18. The used silicon wafers had a disk shape having a diameter of 200 mm, p-type conduction, a crystal orientation of <100>, and a resistivity of 0.1 Ω·cm or more and less than 100 Ω·cm. The silicon wafers were respectively preliminarily polished with a polishing slurry (trade name of GLANZOX 1104) made by Fujimi Incorporated, and then, were polished under the conditions described in the above "Polishing Conditions 1" by using the polishing composition of Example 7, and immediately after that, the silicon wafers were rinsed by using the respective rinsing compositions.

<Rinsing Conditions>
Rinsing machine: Single wafer polishing machine PNX-322 (made by Okamoto Machine Tool Works, Ltd.)
Rinsing load: 5 kPa
Rotation speed of surface plate: 30 rpm
Rotation speed of head: 30 rpm
Rinsing time: 1 min.
Temperature of rinsing composition: 20° C.
Feed rate of rinsing composition: 1 L/min. (continuously fed without being circulated)

The silicon wafer surfaces after rinsing by using the respective rinsing compositions of Example 11 and Comparative Examples 17 and 18 were measured by wafer inspection equipment "Surfscan SP2" made by KLA-Tencor Corporation in DWO mode, and the results of assessment of haze levels of the silicon wafer surfaces after rinsing based on the measurement are shown in Table 2. In the column, "A" means that the haze level was reduced by 5% or more compared to Comparative Example 17 not containing a polyoxyethylene addition nonionic surfactant, "B" means that the reduction of the haze level was less than 5%, and "C" means that the reduction of the haze level was not observed compared to Comparative Example 17.

The silicon wafer surfaces having p-type conduction, a crystal orientation of <100>, a resistivity of 0.1 Ω·cm or more and less than 100 Ω·cm, and a size of 60 mm square were respectively preliminarily polished with a polishing slurry (trade name of GLANZOX 1104) made by Fujimi Incorporated, and then, were polished under the conditions described in the above "Polishing Conditions 1" by using the polishing composition of Example 7. Each of the silicon wafer surfaces after polishing was rinsed under the conditions described in the above "Rinsing Conditions" by using the respective rinsing compositions of Example 11 and Comparative Examples 17 and 18, and then, the silicon wafer was vertically stood and left at rest. After a lapse of 30 seconds, a maximum distance between the outer edge of the silicon wafer and a wet region on the silicon wafer surface was measured, and the results of assessment of wettability on the silicon wafer surfaces after polishing based on the measurement are shown in the column "wettability" in Table 2. In the column, "A" means that the maximum distance between the outer edge of the silicon wafer and the wet region was less than 5 mm, "B" means that the maximum distance was 5 mm or more and less than 40 mm, and "C" means that the maximum distance was 40 mm or more.

TABLE 2

| | | polyoxyethylene addition nonionic surfactant | | | | | |
|---|---|---|---|---|---|---|---|
| | | | | | average number of moles of oxyethylene | assessment | |
| | kind | content (% by mass) | HLB value | weight-average molecular weight | added | haze | wettability |
| Example 11 | polyoxyethylene decyl ether | 0.00013 | 12.1 | 380 | 5 | A | B |
| Comparative Example 17 | — | — | — | — | — | C | B |
| Comparative Example 18 | polyoxyethylene lauryl ether | 0.00013 | 17.7 | 1960 | 40 | C | C |

As shown in Table 2, the haze level of the silicon wafer surface after rinsing in Example 11 is lower compared to Comparative Examples 17 and 18.

Performance Assessment of Concentrated Liquid of Polishing Composition and Concentrated Liquid of Rinsing Composition Each of the above-described polishing compositions of Examples 1 to 10 and the rinsing composition of Example 11 was prepared by diluting concentrated liquid preserved for 6 months at room temperature 20 times with ion-exchange water. In contrast, instead of preparation by diluting concentrated liquid with water, when polishing compositions having the same constituents with the polishing compositions of Examples 1 to 10 and a rinsing composition having the same constituent with the rinsing composition of Example 11 were prepared by arranging necessary components respectively and mixing them, and immediately after the preparation, assessment of haze levels and wettability were performed similar to Examples 1 to 11 by using these polishing compositions and rinsing composition, the obtained results were the same with the cases of Examples 1 to 11.

The invention claimed is:

1. A polishing composition for a silicon wafer, comprising:
water;
a basic compound; and
a nonionic surfactant of a polyoxyethylene adduct selected from the group consisting of polyoxyethylene alkyl ether, polyoxyethylene phenyl ether, polyoxyethylene alkyl phenyl ether, polyoxyethylene alkylamide, polyoxyethylene fatty acid ester, polyoxyethylene sorbitol fatty acid ester, polyoxyethylene castor oil, and polyoxyethylene rosin ester, wherein
the polyoxyethylene adduct has an HLB value of 8 to 15,
the polyoxyethylene adduct has a weight-average molecular weight of 1400 or less,
the polyoxyethylene adduct has an average number of moles of oxyethylene added of 13 or less, and
the polyoxyethylene adduct is contained in the polishing composition in an amount of 0.00001 to 0.1% by mass.

2. The polishing composition according to claim 1, further comprising abrasive grains.

3. The polishing composition according to claim 1, further comprising a wetting agent.

4. A method of polishing a silicon wafer, comprising polishing a silicon wafer by using the polishing composition according to claim 1.

5. A rinsing composition for a silicon wafer, comprising:
water; and
a nonionic surfactant of a polyoxyethylene adduct selected from the group consisting of polyoxyethylene alkyl ether, polyoxyethylene phenyl ether, polyoxyethylene alkyl phenyl ether, polyoxyethylene alkylamide, polyoxyethylene fatty acid ester, polyoxyethylene sorbitol fatty acid ester, polyoxyethylene castor oil, and polyoxyethylene rosin ester, wherein
the polyoxyethylene adduct has an HLB value of 8 to 15,
the polyoxyethylene adduct has a weight-average molecular weight of 1400 or less,
the polyoxyethylene adduct has an average number of moles of oxyethylene added of 13 or less, and
the polyoxyethylene adduct is contained in the rinsing composition in an amount of 0.00001 to 0.1% by mass.

6. The rinsing composition according to claim 5, further comprising a wetting agent.

7. A method of rinsing a silicon wafer, comprising rinsing a silicon wafer after polishing, by using the rinsing composition according to claim 5.

* * * * *